United States Patent [19]

Propst et al.

[11] 4,280,019

[45] Jul. 21, 1981

[54] COMBINATION ACOUSTIC CONDITIONER AND LIGHT FIXTURE

[75] Inventors: Robert L. Propst, Ann Arbor; Travis M. Randolph; Theodore M. Reyda, both of Saugatuck, all of Mich.

[73] Assignee: Herman Miller, Inc., Zeeland, Mich.

[21] Appl. No.: 96,769

[22] Filed: Nov. 23, 1979

Related U.S. Application Data

[62] Division of Ser. No. 857,894, Dec. 6, 1977, Pat. No. 4,214,298.

[51] Int. Cl.³ .................... H04M 1/19; H04K 1/00; H05K 5/00

[52] U.S. Cl. .................... 179/1.5 M; 179/1 AA; 181/155; 181/199

[58] Field of Search .................... 179/1.5 M, 1 AA; 181/153, 155, 199, 201, 206, 211

[56] References Cited

U.S. PATENT DOCUMENTS

| | | | |
|---|---|---|---|
| 3,213,199 | 10/1965 | Snow | 179/1.5 M |
| 3,476,880 | 11/1969 | Flanagan | 179/1.5 R |
| 3,567,863 | 3/1971 | Morrissey | 179/1.5 AA |
| 3,879,578 | 4/1975 | Wildi | 179/1.5 M |
| 3,985,200 | 10/1976 | Sepmeyer | 179/1.5 M |
| 3,985,957 | 10/1976 | Torn | 179/1.5 M |
| 4,010,324 | 3/1977 | Jarvis et al. | 179/1.5 M |
| 4,052,564 | 10/1977 | Propst et al. | 179/1.5 M |
| 4,059,726 | 11/1977 | Watters et al. | 179/1.5 M |
| 4,098,370 | 7/1978 | McGregor et al. | 179/1.5 M |
| 4,185,167 | 1/1980 | Cunningham et al. | 179/1.5 M |

FOREIGN PATENT DOCUMENTS

| | | | |
|---|---|---|---|
| 1420201 | 1/1976 | United Kingdom | 179/1 AA |

*Primary Examiner*—Howard A. Birmiel
*Attorney, Agent, or Firm*—Olsen and Stephenson

[57] ABSTRACT

A combination light fixture and acoustic conditioner assembly particularly useful in modular room enclosures wherein the ceiling is spaced above the enclosure walls. The invention provides for indirect lighting means and means for masking external sounds in the vicinity of the light fixture assembly. The assembly includes a reflector positioned so that light and sound waves contacting the reflector are dispersed in a plurality of directions due to the concavity of the reflector and undulations therein and eventually contact the ceiling where they are further reflected and spread. Dispersion of sound waves in this manner provides a pleasant, unintelligible sound which masks external sounds that might otherwise distract occupants of the modular room enclosures.

4 Claims, 10 Drawing Figures

FIG. 1
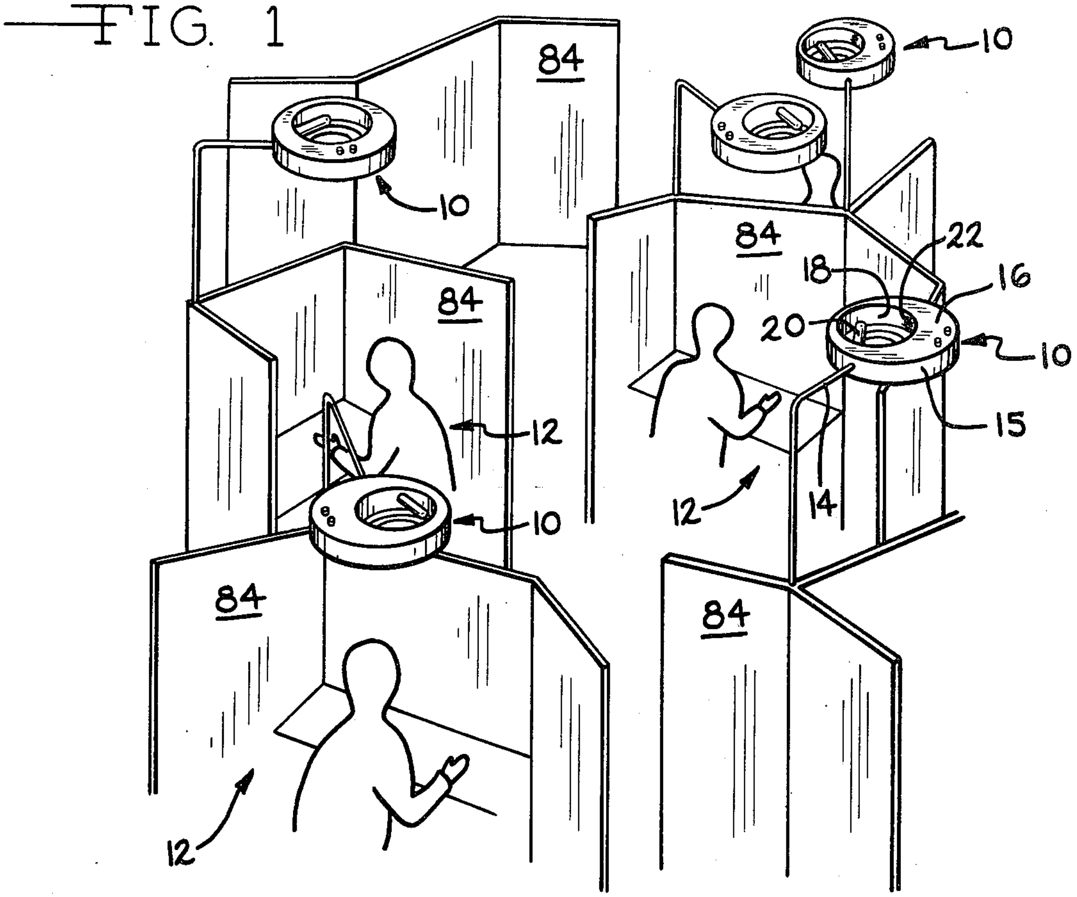
FIG. 2
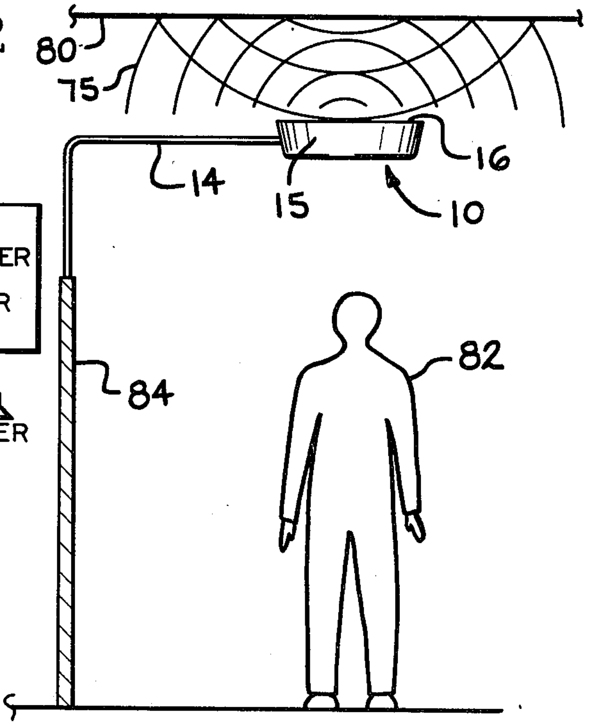
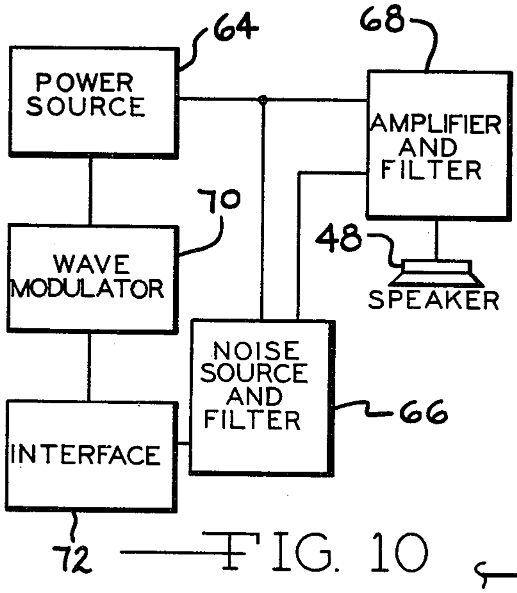
FIG. 10

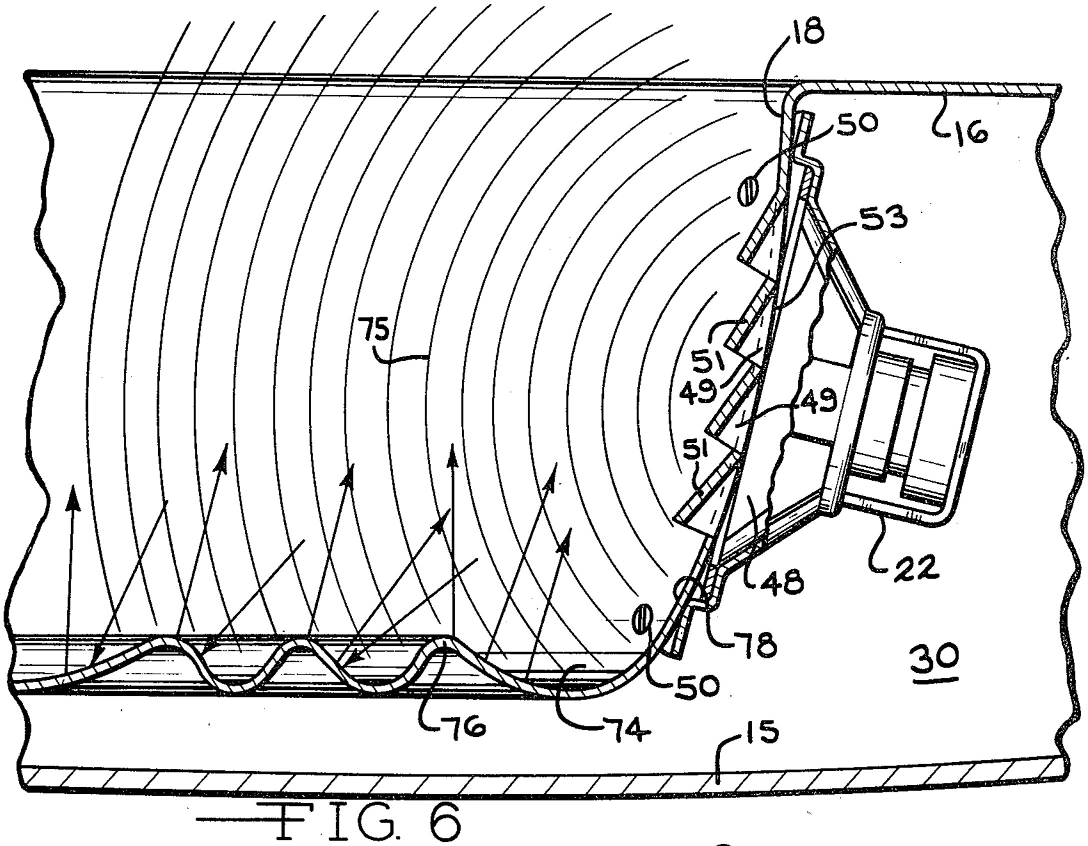
FIG. 6
FIG. 7
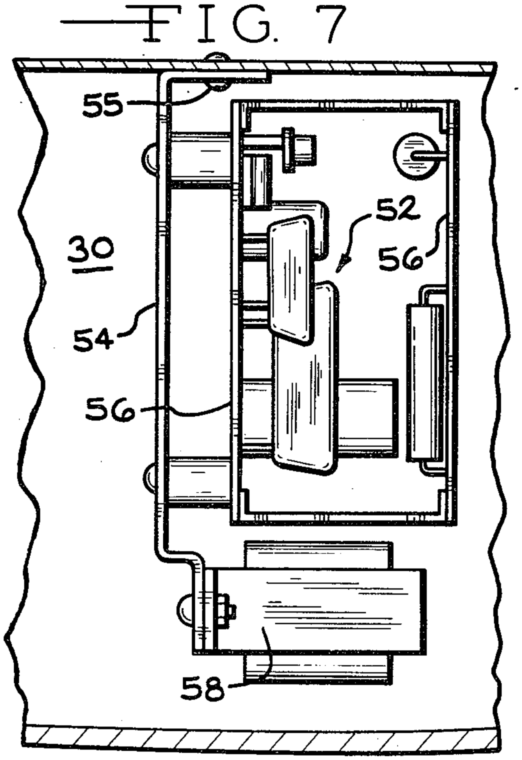
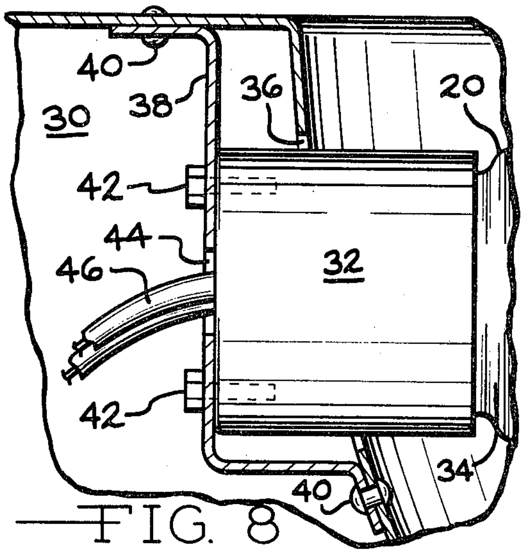
FIG. 8
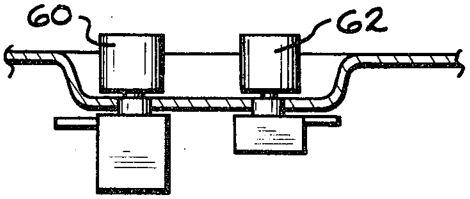
FIG. 9

COMBINATION ACOUSTIC CONDITIONER AND LIGHT FIXTURE

REFERENCE TO PENDING APPLICATION

This application is a division of application Ser. No. 857,894, filed Dec. 6, 1977 now U.S. Pat. No. 4,214,298.

BACKGROUND OF THE INVENTION

Modern open plan offices are provided with work areas that are partitioned by panels which generally have a height less than the height of the ceiling. The panels and ceiling are sometimes acoustically engineered to absorb vocal and machine noises attendant to common office activity, but not all of these sounds can be eliminated by acoustical engineering and so noise distraction remains a problem.

With respect to speech, it has been found that the greatest distraction is caused not by the loudness of the speech, but by its understandability. Thus, a sound system which can generate a masking sound signal which decreases the understandability of the speech without itself becoming a distraction is desirable.

Effective masking sound systems have in the past generally been designed specifically for the particular office space in which they are located and as such are costly. The majority of these systems are installed in the ceiling and become a permanent fixture of the office. The use of these systems has thus incurred high installation and maintenance costs and reduced the feasability of moving the system to various locations within the office space or upon vacating the premises, in which case, the adaptability of the system would also be in question.

Portable sound masking devices illustrated in the prior art have often produced a continuous sound spectrum which may be ineffective, monotonous, and more annoying than the sounds that are intended to be masked.

A masking sound gererator is disclosed in application Ser. No. 614,917, filed Sept. 19, 1975, and assigned to the assignee of the present invention which is presently being used satisfactorily to overcome the deficiencies present in the prior art.

It is an object of the present invention, therefore, to provide an improved masking sound apparatus which is also integrated into the general environment by incorporating the apparatus into an indirect lighting structure which is also a desirable part of the modular office.

SUMMARY OF THE INVENTION

The present invention provides a combination acoustic conditioner and light fixture assembly having indirect lighting means and improved means for masking external sounds in the vicinity of the assembly.

The assembly comprises a support, a housing mounted on the support which is generally circular in overview, a reflector secured to the housing having a recessed incurvate portion which faces substantially upwardly toward the ceiling and is also circular in overview, a light source mounted on the housing adjacent to the reflector and a sound emitter also mounted on the housing adjacent to the reflector. The vertical axis of the housing is offset from the vertical axis of the recessed portion so that a chamber or enclosure is formed between the housing and the reflector in which the sound emitter is positioned. Electronic circuitry capable of providing an electrical signal and converting it into an audible sound signal and modulation means operable to cyclically vary frequencies of the sound signal, is contained within the chamber. The sound emitter is positioned in the chamber so that sound waves emanating therefrom are directed against the reflector.

The recessed portion of the improved reflector of this invention has non-uniformly sloped undulate surfaces which are exposed to the light and the sound waves. Thus, light and sound waves contacting the reflector are dispersed in a plurality of directions due to the concavity of the recessed portion of the reflector and the undulations therein and eventually contact the ceiling of the room enclosure in which the assembly is positioned where they are further reflected and spread out. Dispersion of light rays in this manner provides uniform diffusion of light throughout the room enclosure and elimination of bright spots. The improved reflector is coupled to the sound emitter so that it also enables a wider distribution of sound waves and thereby effectively extends the size of the speaker. As a result, propagation of low-frequency sound waves is intensified giving the resulting audible sound signal a desirable undertone. This undertone, combined with the cyclical variation of sound frequencies, provides a signal which efficiently masks external sounds but is easily acclimatable by users of the office space. The invention thus provides more efficient distribution of light and sound waves in the vicinity of the light fixture assembly and a more desirable masking sound as well.

The present light fixture assembly is also advantageous from the standpoint of cost and space. Since the light and sound sources are supported on the same fixture and utilize the same reflector, the need for separate light and sound apparatus is obviated. Furthermore, the masking sound apparatus of this invention, since it is maintained outside the view of office space users, is less distracting than prior art masking sound systems in which the source of the sound is obvious to the user.

Further objects, features and advantages of this invention will become apparent from a consideration of the following description, the appended claims and the accompanying drawing, in which:

FIG. 1 is a diagrammatic view showing an office arrangement having work stations divided by partitions on which a plurality of the combination acoustic conditioner and light fixture assemblies of this invention are mounted;

FIG. 2 is a sectional view showing one of the work stations illustrated in FIG. 1 and showing the location of the assembly of this invention intermediate the ceiling and the head of an adult person of average height;

FIG. 6 is an enlarged fragmentary sectional view of another portion of the assembly of this invention, as seen from substantially the line 6—6 in FIG. 3;

FIG. 7 is an enlarged sectional view of still another portion of the assembly of this invention, as seen from the line 7—7 in FIG. 3 illustrating the circuitry associated with the speaker;

FIG. 8 is an enlarged fragmentary sectional view of the assembly illustrating the light source and means for attachment thereof to the housing, as seen from substantially the line 8—8 FIG. 3;

FIG. 9 is a fragmentary sectional view of one wall of the assembly showing the volume and frequency controls of this invention, as seen from substantially the line 9—9 in FIG. 3; and FIG. 10 is a block diagram of the circuitry in the assembly of this invention.

Figure 4:
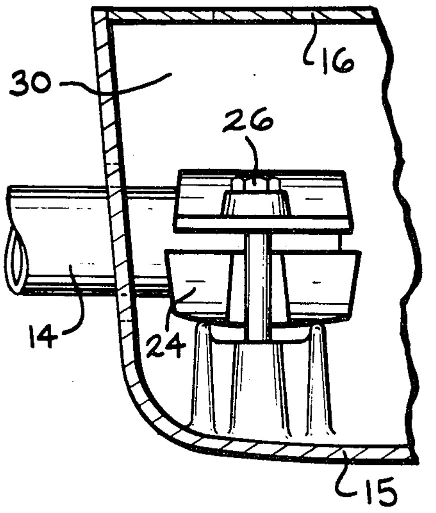
FIG. 4 is an enlarged fragmentary sectional view of a portion of the assembly of this invention as seen from substantially the line 4—4 in FIG. 3.
Figure 5:
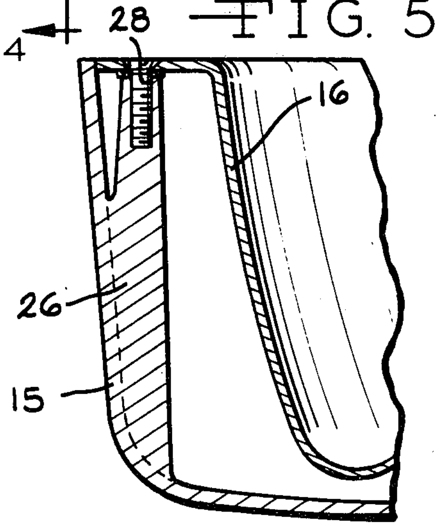
FIG. 5 is an enlarged fragmentary sectional view of the assembly as seen from the line 5—5 in FIG. 3 showing the reflector secured to the housing in the light fixture assembly.

Referring to the drawing, a plurality of combination acoustic conditioner and light fixture assemblies of this invention indicated generally at 10, are shown in FIG. 1 associated with a plurality of office modules 12 which define individual activity zones within an otherwise open room enclosure. Each assembly 10 consists of a movable rod-like support 14, a bowl-shaped housing 15 mounted on the support 14, a reflector member 16 which is mounted on the housing 15 and has a recessed portion 18, a light source 20 and a sound emitter 22 (FIG. 6) mounted on the reflector 16. In FIG. 4 it is seen that the support 14 is secured to the housing 15 by means of a clamp unit 24. A bolt 26 secures the support 14 to the clamp 24 which is in turn mounted on the housing 15. A plurality of upwardly extending projections 26, one of which is shown in FIG. 5, are provided on the housing 15 to attach the reflector 16 thereto. A set screw 28 secures the reflector 16 to each projection 26 and thus to the housing 15.

Figure 3:
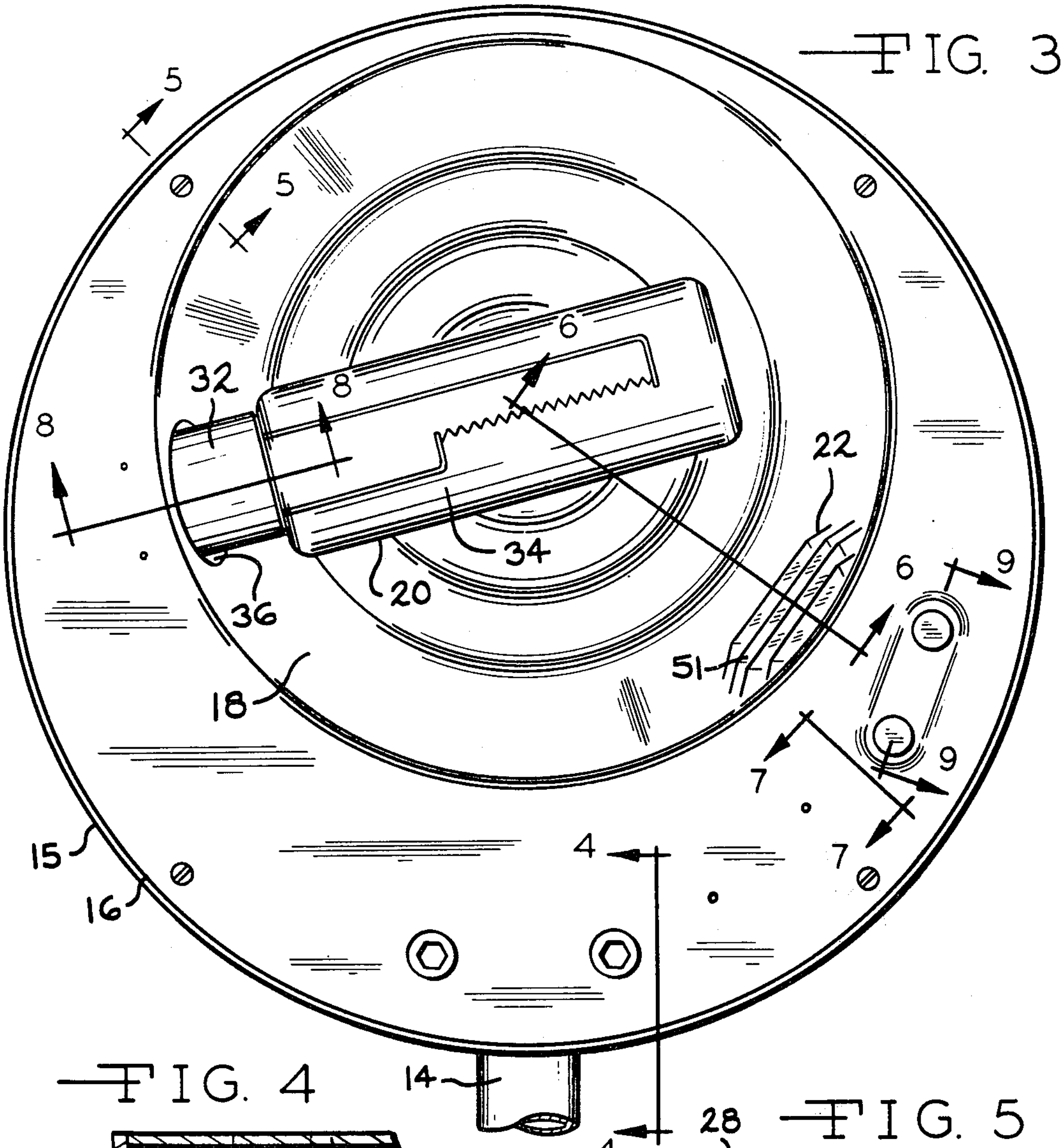
FIG. 3 is a top view of the assembly of this invention.

With reference now to FIG. 3, it is seen that the housing 15 and the recessed portion 18 of the reflector 16 are generally circular in overview with the circumference of the housing 15 being substantially greater than the circumference of the portion 18. The vertical axis of the housing 15 is offset from the vertical axis of the portion 18 so that a chamber or enclosure 30 is formed therebetween for containing the sound emitter 22 and mounting it on the light fixture assembly 10.

The light sorce 20, positioned in the recess 18, is mounted on a socket 32 and consists of an incandescent bulb 34. An opening 36 (FIG. 8) is provided in the reflector 16 and a light support brace 38 which is secured to the reflector 16 by rivets 40 is located behind the opening 36. The socket 32 extends through the opening 36 so that it engages the support brace 38 and is secured to the brace by bolts 42. An aperture 44 is provided in the brace 38 through which electrical leads 46 pass to a conventional electrical outlet (not shown). It is thus seen (FIGS. 3 and 8) that the light source 20 is positioned in the opening 36 so that the bulb 34 overhangs the recessed portion 18 and is thus situated to direct light waves toward the recessed portion 18.

The sound emitter 22 (FIG. 6) includes a speaker 48 secured to the reflector such as by screws 50 and positioned thereon for directing sound waves through openings 49 in the reflector side wall 51 into the recessed portion 18. Downwardly and inwardly inclined baffles 53 are formed on the reflector opposite the openings 49. The speaker 48 is connected in a conventional manner to electronic circuitry 52 (FIG. 7) secured to a mounting chassis 54 which is mounted on the reflector 16 by rivets 55, only one of which is shown. As seen in FIG. 7, a pair of electronic circuit component boards 56, on which the sound producing circuitry 52 is located, are each mounted to chassis 54. Thus, servicing of a defective unit can be accomplished by easy and quick replacement of a circuit board 56. A power transformer 58 is mounted on the chassis 54. An on-off and volume control 60 (FIG. 9), rotatably mounted on the reflector 16, is connected (not shown for purposes of clarity) to one of the circuit boards 56 and allows the user to adjust the volume of sound from speaker 48 within a certain defined range. The volume control 60 cannot increase the sound intensity past the point at which masking sounds are part of the ambient background to insure that the sound emitter 22 cannot be turned up to a volume which can be annoying to people in the area. A bass-treble control 62, mounted on the reflector 16, is connected (not shown) to a circuit board 54 to control, within a small range, the frequency of the sound signals to thereby accommodate the personal tastes and perceptions of the user.

The components of the electronic circuitry 52 are all solid state and transistorized to provide for continuous use without heat build-up or frequency distortion. The circuitry 52 (FIG. 10) comprises a power source 64 connected to a noise source and filter 66 to produce an electronic signal which is amplified and filtered by the amplifier and filter 68 and converted to an audible sound signal by the speaker 48. In addition, the power source 64 drives a wave modulator 70 which is connected to the noise source and filter 66 by an interface 72 and which cyclically varies the amplitude of the sound signal emitted by the speaker 48.

Referring again to FIG. 6, it is seen that the recessed portion 18 of the reflector 16 of this invention has a bottom surface 74 which is exposed to light and sound waves. The surface 74 is formed with non-uniformly sloped undulations 76 and is formed of conventional reflecting material such as polished metal or the equivalent ot provide efficient reflection of light and sound waves. FIG. 6 shows sound waves 75 emanating from the speaker 48, but it is to be understood that light waves emanate from the bulb 34 in a similar manner; thus, the term "waves" shall hereinafter be used to denote both light and sound waves. Waves 75 striking the recessed portion 18 are reflected in a plurality of directions, due to the concavity of the portion 18 and the undulations 76 therein, in contrast to unidirectional deflection of waves by plane reflecting surfaces. For example, the recessed portion 18 has an arcuate side wall portion 78 which operates to deflect waves 75 directed thereagainst substantially toward the vertical axis of the recessed portion 18. Waves 75 striking the undulations 76 are deflected in a plurality of directions determined by the angle of incidence of the incoming wave 75 and the particular slope of the undulation 76 at the point of reflection. The reflector 16 of the present invention thus provides uniform widespread diffusion of light and sound waves 75 in the vicinity of the office module 12.

The assembly 10 is particularly useful at a height intermediate the ceiling 80 of a room enclosure and the head of a standing adult 82 of average height, as illustrated in FIG. 2. The assembly 10 is preferably mounted on one of a plurality of partitioning panels 84 which separate the office modules 12 and is positioned on the panel 84 so that the reflector 16 faces upwardly toward the ceiling 80. Thus, waves 75 contacting the surfaces 74 of the reflector 16 are dispersed in a plurality of directions, as described above, and eventually contact the ceiling 80 where they are further reflected and dispersed. The reflector 16 and ceiling 10 thus cooperate to provide a desirable softening and spreading effect to the waves 75.

In addition to providing uniform dispersion of the waves 75, the assembly 10 produces an improved sound signal for masking external sounds in the vicinity of the assembly 10. The incurvate recessed portion 18 of the reflector 16 and the undulation 76 therein enables a wider distribution of the waves 75 and thereby extends the size of the speaker 48. As a result, propagation of low-frequency sound waves 75 is intensified and the resulting audible signal is thereby provided with a desirable undertone. In combination with the wave modulator 70, which cyclically varies the signal to give the masking sound a natural "ebb and flow" which is characteristic of most random sounds, the reflector 16 enables the assembly 10 to produce a pleasant masking sound which is easily acclimatable by users of the office modules 12.

Each unit 10 can be adjusted by the user to fit the particular sound environment that exists in the area of the assembly 10. If, for example, the external sounds are of a low frequency such as that of air rushing through a ventilation system, the user may desire to adjust the bass-treble control 62 increasing the high thereby providing for an adequate blend of high and low frequencies. If, on the other hand, the external sound signals have high frequency such as that of certain machines, the user may adjust the bass-treble control 62 so that a balancing sound is emitted to blend the high and low frequencies thereby effectively masking the undesired sounds.

It can thus be seen that a combination sound conditioner and light fixture 10 is provided for use in office modules 12 that includes a light source 20, a sound emitter 22 and a reflector 16 contained therein. The reflector 16 has an incurvate portion 18 having undulations 76 therein so that light and sound waves 75 emanating from the light source 20 and sound emitter 22 are dispersed in a plurality of directions upon contact with the reflector 16. The waves 75 are thus uniformly disseminated in the vicinity of the assembly 10 to provide adequate lighting and effective sound masking therein. The sound signal reaching users of the modules 12 is provided with subtle frequency variations and a slight undertone characteristic which make the sound signal easily acclimatable by the user.

What is claimed:

1. Sound generating apparatus adaptable for use in a room enclosure having a ceiling comprising a support, a bowl shape reflecting element mounted on said support, circuit means providing an electrical signal and converting said signal into an audible sound signal, modulation means for cyclically varying frequencies of said sound signal and a speaker mounted on said support and positioned adjacent said reflecting element so that sound waves emanating from said speaker are directed toward said element, said reflecting element having incurvate surfaces provided with non-uniform undulations so that sound waves contacting said undulations are dispersed in a plurality of directions and reflect from said ceiling, thus producing an indistinct, unintelligible sound for masking external sounds in the vicinity of said sound generating apparatus.

2. Sound generating apparatus according to claim 1 further including light source means mounted on said support in a position to direct light against said undulations.

3. Sound generating apparatus according to claim 2 further including a generally cylindrical housing extending about said reflecting element and defining with said element an enclosure located to one side of said incurvate surfaces, said speaker being disposed in said enclosure and being secured to said reflector so that said reflector forms an extension of said speaker.

4. Sound generating apparatus according to claim 3 wherein said speaker is secured to said reflecting element at a position above said undulations, said element having openings therein aligned with said speaker and bounded by baffles arranged to direct sound waves from said speaker traveling through said openings toward said undulations.

* * * * *